US006116373A

United States Patent [19]

Dodd

[11] Patent Number: 6,116,373

[45] Date of Patent: *Sep. 12, 2000

[54] ACOUSTIC HORNS FOR LOUDSPEAKERS

[75] Inventor: Mark Dodd, Suffolk, United Kingdom

[73] Assignee: KH Technology Corporation, George Town, Cayman Islands

[ * ] Notice: This patent issued on a continued prosecution application filed under 37 CFR 1.53(d), and is subject to the twenty year patent term provisions of 35 U.S.C. 154(a)(2).

[21] Appl. No.: 09/083,829

[22] Filed: May 22, 1998

[30] Foreign Application Priority Data

May 24, 1997 [GB] United Kingdom .................. 9710702

[51] Int. Cl.[7] ...................................................... H05K 5/00

[52] U.S. Cl. .......................... 181/152; 181/151; 181/184

[58] Field of Search .................................... 181/152, 146, 181/151, 180, 184, 208

[56] References Cited

U.S. PATENT DOCUMENTS

| | | | |
|---|---|---|---|
| 2,293,181 | 8/1942 | Terman . | |
| 4,381,831 | 5/1983 | Putnam . | |
| 5,233,136 | 8/1993 | Hamada | 181/152 |
| 5,793,000 | 8/1998 | Sabato et al. | 181/152 |

FOREIGN PATENT DOCUMENTS

| | | |
|---|---|---|
| 0295644A2 | 12/1988 | European Pat. Off. . |
| 0530575A1 | 10/1993 | European Pat. Off. . |
| 58-094651 | 4/1983 | Japan . |
| 83152277 | 8/1983 | Japan . |
| 87232673 | 9/1987 | Japan . |
| 04159371 | 6/1992 | Japan . |
| 05279623 | 10/1993 | Japan . |
| 94218047 | 8/1994 | Japan . |
| 07111696 | 4/1995 | Japan . |
| 224635 | 8/1923 | United Kingdom . |
| 322514 | 9/1928 | United Kingdom . |
| 335515 | 4/1929 | United Kingdom . |
| 378403 | 4/1931 | United Kingdom . |
| 500493 | 9/1937 | United Kingdom . |
| WO91/19406 | 12/1991 | WIPO . |

*Primary Examiner*—Khanh Dang
*Attorney, Agent, or Firm*—Kenneth L. Sherman, Esq.; Sherman & Sherman

[57] ABSTRACT

An improved acoustic horn for loudspeakers is provided. The acoustic horn of the referred embodiment of the present invention includes a one piece body that incorporates damping material within the body. Preferably, the one piece body is slotted and vibration damping material is provided within the slots. The horn is fabricated by casting from suitable metals and metal alloys. In the preferred embodiment, the body comprises four outwardly curved and flared side walls and is generally rectangular. Each wall of a pair of the opposed side walls is cast with a slot. Vibration damping material is provided in each slot to substantially reduce the structural resonances of the one piece body, so that the acoustic horn has enhanced vibration damping. Various vibration damping materials that are flexible relative to the body and have a high loss tangent are used. Suitable materials include hot melt adhesives, epoxy resins, and commercially available elastomeric materials.

20 Claims, 1 Drawing Sheet

ACOUSTIC HORNS FOR LOUDSPEAKERS

CROSS-REFERENCES TO RELATED APPLICATIONS

This application claims priority under 35 U.S.C. §119 from United Kingdom Patent Application No. 9710702.3, filed May 24, 1997.

BACKGROUND OF THE INVENTION

1. Field of the Invention

The present invention relates generally to acoustic horns for loudspeakers and to methods of making such horns, and more particularly, to a cast acoustic horn for a loudspeaker having enhanced vibration damping characteristics.

2. Description of Related Art

A loudspeaker is a transducer which takes electrical energy and converts it into acoustic energy or sound. It includes a drive unit which converts the electrical signal into acoustic energy and a directional flare which directs the acoustic energy.

High quality reproduction of sound for speech and music requires the use of pressure drive units, known in the art as compression drivers. The compression drivers are at high levels coupled to a horn flare.

Traditionally, horn flares have been cast from rigid materials, such as metals and metal alloys. The use of a metal or metal alloy, such as aluminum, for fabricating the horn flare provides good mechanical strength, reduces the need for any additional bracing in the enclosure of the horn flare and also serves as a heat sink to provide additional cooling for the drive unit.

Casting horn flares from metals and metal alloys provides a horn flare that is economical to produce. However, the bell-like shape of such horn flares and the metallic materials produce a structure which suffers from severe structural resonances. These structural resonances are excited by vibration of the compression driver and cause a characteristic ringing sound which interferes with the quality of the sound produced by the loudspeaker.

Damping this sort of structural vibration is difficult. Prior methods have required large quantities of damping material. Other prior methods alternatively provide a thin film of damping material trapped between the horn and an additional structural member located between the horn and compression driver. However, in these prior damping methods, structural vibrations of the horn flare are not always satisfactorily damped and desired performance and costs objectives, among several other factors are often compromised.

In an attempt to reduce the structural resonances, and thus the characteristic ringing sound, plastic materials have been used as an alternative to metal for making the loudspeaker horn. However, a disadvantage of plastic materials is that these materials require additional support of a rear portion of the horn flare, lack the strength of metals, and do not provide a good heat sink for cooling of the drive unit.

The heat sink effect of the horn flare is best implemented by machining the flange of the horn to a flat shape, and replacing a foamed plastic gasket with a very thin film comprising thermally conductive materials. However, eliminating the foam gasket causes the vibrational damping on the horn to be reduced.

OBJECTS OF THE INVENTION

It is therefore an object of the present invention to provide an improved acoustic horn for a loudspeaker;

It is another object of the present invention to provide an improved loudspeaker horn flare that is economical to fabricate, provides cooling for a compression driver coupled thereto, and has enhanced vibration damping;

It is a further object of the present invention to provide an economical method of fabricating a horn flare; and It is yet another object of the present invention to provide an improved loudspeaker horn flare that is configured to enable vibration damping material to be added for substantially reducing structural resonances.

SUMMARY OF THE INVENTION

These and other objects and advantages of the present invention are achieved by providing an improved acoustic horn for loudspeakers. The acoustic horn of the present invention includes a flared one piece body that preferably incorporates damping material within the body.

In the preferred embodiment of the present invention, the one piece horn body is slotted. Vibration damping material is provided within the slots. The horn is preferably fabricated by casting from suitable metals and metal alloys, such as aluminum or an aluminum alloy.

In the preferred embodiment of the present invention, the one piece body comprises four outwardly curved and flared side walls and is generally rectangular. The rectangular one piece body has a first pair of opposed side walls which are somewhat wide and a second pair of opposed side walls which are somewhat narrow.

In the preferred embodiment of the present invention, each side wall of a pair of the opposing side walls, such as each of the first pair of opposing wide side walls, is cast with a slot. Vibration damping material is provided in each slot. This vibration damping material substantially reduces the structural resonances of the one piece body so that the loudspeaker horn flare of the present invention has enhanced vibration damping.

Various vibration damping materials can be used with the invented flared horn body. Suitable vibration damping materials are flexible relative to the material comprising the one piece body and have a high loss tangent. Suitable vibration damping materials include hot melt adhesives, epoxy resins, and commercially available elastomeric materials.

The vibration damping material is disposed into the slots using known methods applicable to the selected damping material. For example, when elastomeric materials are selected, the materials may be held in place by an appropriate adhesive.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

DETAILED DESCRIPTION OF THE PREFERRED EMBODIMENTS

The following description is provided to enable any person skilled in the art to make and use the invention and sets forth the best modes presently contemplated by the inventor of carrying out his invention. Various modifications, however, will remain readily apparent to those skilled in the art, since the generic principles of the present invention have been defined herein.

Figure 1:
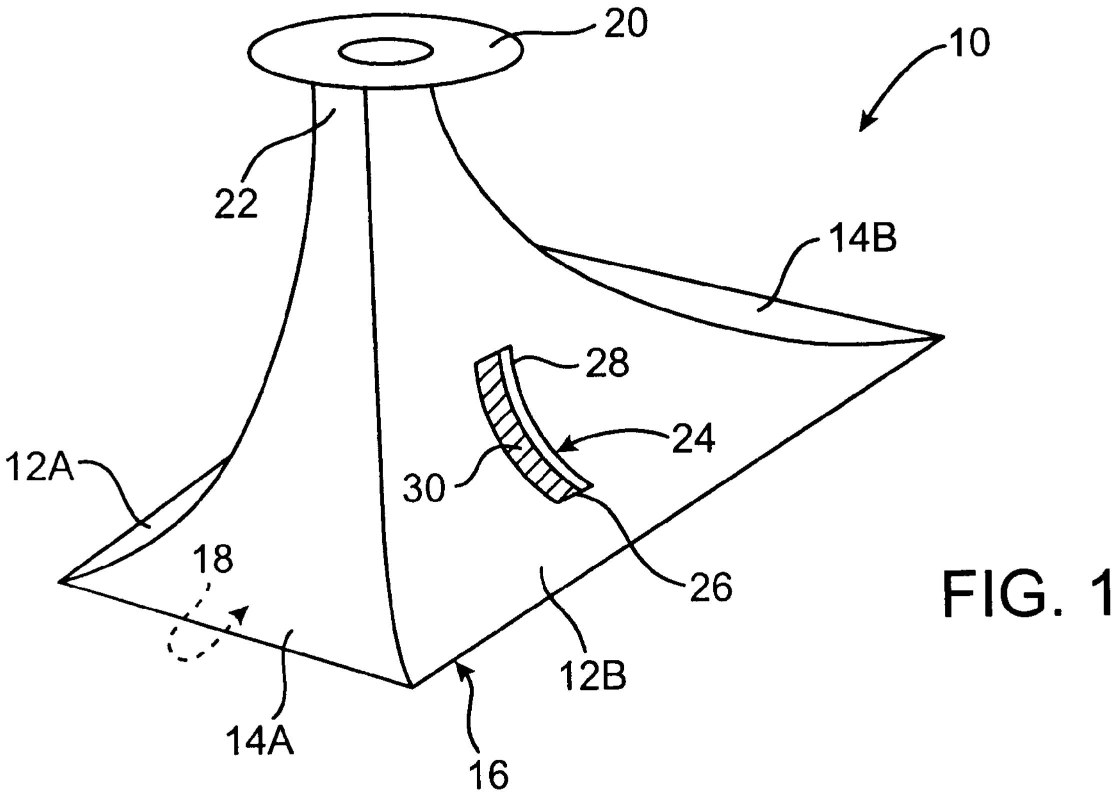
FIG. 1 is a schematic, perspective view showing a flared acoustic horn of the preferred embodiment of the present invention.

Referring now to FIG. 1 of the drawings, there is shown, generally at 10, a preferred embodiment of an improved acoustic horn for loudspeakers constructed according to the principles of the present invention. The acoustic horn 10 of the present invention comprises a flared one piece body that is adapted to be coupled to a compression driver (not shown). In the preferred embodiment of the present invention, the flared one piece horn 10 is fabricated using a one-piece casting comprising a known metal or metal alloy, such as aluminum or an aluminum alloy, for example.

The flared one piece horn body 10 of the preferred embodiment of the present invention comprises four outwardly curved and flared side walls, such that a first pair of opposing side walls 12A, 12B are somewhat wide and a second pair of opposing side walls 14A, 14B are somewhat narrow. A lateral measurement along each of the side walls 12A, 12B, 14A, 14B is generally rectangular in cross-sectional configuration, so that a flared or wide end 16 of each of the side walls 12A, 12B, 14A, 14B defines a rectangular aperture 18.

An annular flange 20 is affixed to a narrow end 22 of the side walls 12A, 12B, 14A, 14B which allows the horn body 10 to be coupled to a compression driver (not shown). It should be appreciated that the present invention is also applicable to acoustic horns for loudspeakers that have shapes other than the rectangular shape shown in the drawings, such as a square, a circle or an oval. The rectangular shape is only being shown for illustrative purposes.

In accordance with the preferred embodiment of the present invention, a slot 24 is formed through at least some of the side walls 12A, 12B, 14A, 14B of the horn body 10. Preferably, a slot 24 is provided in each one of a selected pair of the opposing side walls 12A, 12B, or 14A, 14B. Most preferably, a slot 24 is provided in each one of the pair of somewhat wide side walls 12A, 12B. An end 26 of the slots 24 is preferably located proximal to the flared end 16 of the side walls 12A, 12B.

Figure 2:
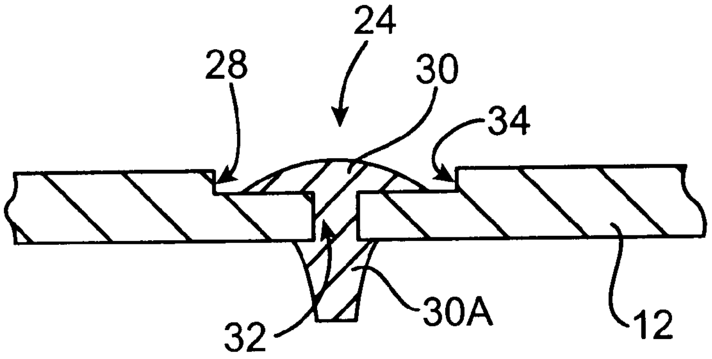
FIG. 2 is a fragmentary, cross sectional view showing a first type of vibration damping material disposed in a slot of the flared horn of the preferred embodiment of the present invention.
Figure 3:
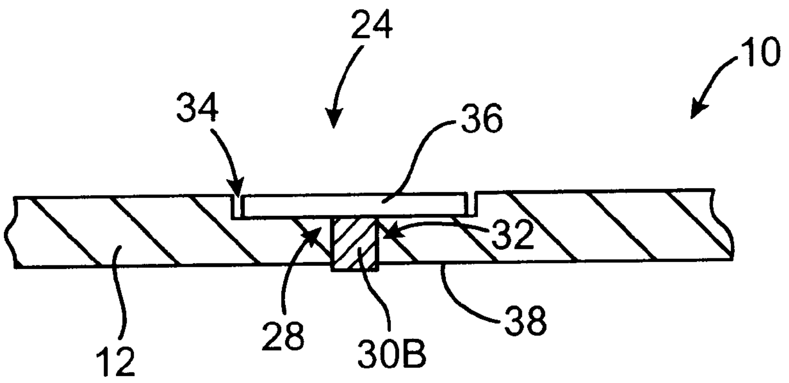
FIG. 3 is a fragmentary, cross sectional view showing a second type of vibration damping material disposed in a slot of the preferred embodiment of the present invention.

Referring now to FIGS. 1–3, the slots 24 are preferably elongated and somewhat narrow, with their longitudinal axis extending perpendicularly between the flared end 16 and narrow end 22 of the side walls 12A, 12B. In the preferred embodiment of the present invention, the slots 24 are at least 75 millimeters (mm) long and can extend substantially the length of the side walls 12A, 12B. Additionally, the slots 24 are not less than approximately 1 mm wide.

In the preferred embodiment of the present invention, it is not necessary that the slots 24 are linear. Slots 24 having different suitable configurations may alternatively be utilized within the scope of the invention.

The slots 24 of the preferred embodiment have side edges 28 that may be stepped as shown in FIG. 2 and FIG. 3. Alternatively, the side edges 28 may be tapered or they may by linear and extend parallel to each other. The configuration of the side edges 28 typically depends upon the manner in which the horn flare body 10 is cast and how the slots 24 can best be formed in that process. Alternatively, the slots 24 may be machined into the horn body 10, after the casting process, with the side edges 28 having any suitable configuration.

Referring still to FIGS. 1–3, each of the slots 24 is filled with a vibration damping material 30. As shown in FIG. 2, an extrusion of a suitable plastic material 30A may be pushed into a narrow channel 32 and extends over the wide ledges 34 of the stepped slot 24, so that the vibration damping material 30A forms a tight fit within the slot 24.

As shown in FIG. 3, the vibration damping material may also comprise a hot melt adhesive 30B that is disposed within the narrow channel 32 of the slot 24 to fill the narrow channel 32. The wide ledges 34 of the slot may carry a label 36 or other identifying material which need not be vibration damping material.

The vibration damping material 30 may comprise any one of several well known vibration damping materials that are flexible relative to the material comprising the one piece body 10 and have a high loss tangent. For example, the damping material 30 may comprise a hot melt adhesive or other adhesive.

Further, the slots 24 can be substantially filled with an elastomer and an adhesive material can be provided at the underside 38 of the slot 24 to hold the elastomer in place. Alternatively, a high loss plastic material extrusion, molding, or an appropriate elastomeric material can also be used. An epoxy resin is a further alternative damping material which may be used within the scope of the preferred embodiment of the present invention.

As shown in the preferred embodiment of the present invention, the position, size and configuration of the slots 24 will depend upon casting restraints and the need to achieve sufficient vibration damping. The present invention 10 involves modifying the geometry of the horn flare body 10 to provide placements where vibration damping material 30 can be included. In effect, a constrained layer is provided and velocity maxima is also produced along the lines where vibration damping is applied. A slot 24 in each of the opposing walls 12A, 12B, as illustrated in FIG. 1, are sufficient to achieve the necessary damping. Alternatively, slots 24 may also be provided in all four walls 12A, 12B, 14A, 14B.

Thus, there has been described an improved acoustic horn for loudspeakers. The acoustic horn of the preferred embodiment of the present invention includes a flared one piece body that incorporates vibration damping material within the body. The one piece horn body is slotted, with the vibration damping material provided within the slots. The vibration damping material substantially reduces the structural resonances of the one piece body. In this way, the loudspeaker horn flare of the preferred embodiment of the present invention has enhanced vibration damping for substantially reducing structural resonances thereof, while still being economical to fabricate.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. An acoustic horn for a loudspeaker comprising:

a body defining an aperture extending therethrough;

at least one opening formed on said body; and a vibration damping material autonomously disposed across the opening and without any structure extending therefrom.

2. The acoustic horn of claim 1 wherein the vibration damping material is flexible relative to the material of the body.

3. The acoustic horn of claim 2 wherein the vibration damping material has a high loss tangent.

4. The acoustic horn of claim 2 wherein the vibration damping material reduces the velocity maxima of energy waves traveling through the body for reducing structural resonances thereof.

5. The acoustic horn of claim 1 wherein the body is cast from a metal alloy.

6. An acoustic horn for a loudspeaker comprising:

a unitary body having an open end and another end configured to be coupled to a compression unit, the body having at least one opening therethrough, and an aperture extending between the open end and other end of the body; and a vibration damping material autonomously disposed in the opening without an additional structure extending from said opening, the vibration damping material being flexible relative to the material of the body so that the velocity maxima of energy waves traveling through the body is reduced for reducing structural resonances of the body.

7. The acoustic horn of claim 6 wherein the body is configured with a pair of opposed openings, the openings shaped complementary to the geometry of the body so that vibrations traveling along the openings are damped by the vibration damping material located within the openings for reducing structural resonances of the body.

8. The acoustic horn of claim 7 wherein the opposed openings are elongated and extend substantially the length of the body.

9. The acoustic horn of claim 8 wherein the unitary body comprises four outwardly curved and flared side walls, such that a first pair of opposed side walls are somewhat wide and a second pair of opposed side walls are somewhat narrow, the side walls provided with a generally rectangular cross-sectional configuration so that the open end body is flared and is generally rectangular cross-sectional, a selected pair of first and second pairs of opposing side walls provided with the elongated openings extending substantially the length thereof.

10. The acoustic horn of claim 9 wherein the opposed openings are provided in the first pair of the opposing side walls.

11. The acoustic horn of claim 8 wherein the elongated openings are at least approximately 55 mm in length.

12. The acoustic horn of claim 11 wherein the elongated openings are at least approximately 75 mm in length.

13. The acoustic horn of claim 6 wherein the vibration damping material comprises a vibration damping material that is flexible relative the material of the unitary body and has a high loss tangent.

14. The acoustic horn of claim 13 wherein the vibration damping material comprises a vibration damping material selected from the group consisting of hot melt adhesives, epoxy resins, elastomeric materials, and plastics materials.

15. The acoustic horn of claim 14 wherein the vibration damping material comprises an extrusion of a suitable plastic material disposed into the elongated opening, the plastic material secured to the opening by means of an adhesive material.

16. The acoustic horn of claim 14 wherein the vibration damping material is a hot melt adhesive disposed into the elongated opening.

17. The acoustic horn of claim 8 wherein the elongated openings are formed with side edges having a predetermined configuration.

18. The acoustic horn of claim 17 wherein the side edges of the elongated openings are linear and extend substantially parallel to each other.

19. The acoustic horn of claim 17 wherein the side edges of the elongated openings are a selected one of stepped and tapered relative to one another.

20. A loudspeaker comprising:

a compression driver; and an acoustic horn, including at least one wall, the wall being constructed from a first material and having an opening therein; and a second flexible vibration damping material being autonomously disposed within and occluding said opening, and without a separate structure extending from said opening.

* * * * *